US010049765B2

(12) United States Patent
Nagai

(10) Patent No.: US 10,049,765 B2
(45) Date of Patent: Aug. 14, 2018

(54) DYNAMIC RANDOM ACCESS MEMORY HAVING E-FUSES USED AS CAPACITORS COUPLED TO LATCHES

(71) Applicants: United Microelectronics Corp., Hsinchu (TW); Fujian Jinhua Integrated Circuit Co., Ltd., Fujian province (CN)

(72) Inventor: Yukihiro Nagai, Saijo (JP)

(73) Assignees: United Microelectronics Corp., Hsinchu (TW); Fujian Jinhua Integrated Circuit Co., Ltd., Jinjiang, Fujian Province (CN)

( * ) Notice: Subject to any disclaimer, the term of this patent is extended or adjusted under 35 U.S.C. 154(b) by 36 days.

(21) Appl. No.: 15/463,603

(22) Filed: Mar. 20, 2017

(65) Prior Publication Data
US 2018/0182469 A1 Jun. 28, 2018

(30) Foreign Application Priority Data

Dec. 23, 2016 (CN) .......................... 2016 1 1204889

(51) Int. Cl.
G11C 29/00 (2006.01)
G11C 11/4096 (2006.01)
G11C 11/408 (2006.01)
(52) U.S. Cl.
CPC ........ G11C 29/787 (2013.01); G11C 11/4087 (2013.01); G11C 11/4096 (2013.01)

(58) Field of Classification Search
CPC .............. G11C 29/787; G11C 11/4087; G11C 11/4096
See application file for complete search history.

(56) References Cited

U.S. PATENT DOCUMENTS 5,841,961 A * 11/1998 Kozaru ................. G11C 29/80
365/200
5,859,801 A 1/1999 Poechmueller
(Continued)

OTHER PUBLICATIONS

Yuji Kihara, "SRAM, " The Institute of Electronics, Information and Communication Engineers (Knowledge Base), Apr. 14, 2010, pp. 1-17, with partial English translation thereof.
(Continued)

Primary Examiner — Vu Le
Assistant Examiner — Sung Cho
(74) Attorney, Agent, or Firm — J.C. Patents

(57) ABSTRACT

A dynamic random access memory (DRAM) has a main memory cell array and a redundant component unit. The redundant component unit includes a plurality of e-fuses and a latch region. The plurality of the e-fuses are arranged into a first e-fuse part and a second e-fuse part, wherein the first e-fuse part is used to store address information of a fault memory cell in the main memory cell array and the second e-fuse part is used as a plurality of capacitors. The latch region includes a plurality of latches used to store the address information of the fault memory cell stored in the first e-fuse part, wherein the plurality of the capacitors of the second e-fuse part are respectively coupled to the plurality of the latches to provide a capacitance value for an input/output (I/O) endpoint of each of the latches.

11 Claims, 7 Drawing Sheets

(56) References Cited

U.S. PATENT DOCUMENTS

| | | | | |
|---|---|---|---|---|
| 5,910,921 A * | 6/1999 | Beffa | ................ | G11C 29/44 |
| | | | | 365/200 |
| 6,131,177 A * | 10/2000 | Takeuchi | ............ | G06F 11/106 |
| | | | | 714/767 |
| 6,373,760 B1 * | 4/2002 | Ohbayashi | ........... | G11C 29/785 |
| | | | | 365/156 |
| 6,625,056 B1 | 9/2003 | Kihara | | |
| 9,633,750 B2 * | 4/2017 | Park | ................ | G11C 29/78 |
| 9,786,390 B2 * | 10/2017 | Kim | ................ | G11C 29/78 |
| 2002/0191468 A1 * | 12/2002 | Toda | ................ | G11C 17/16 |
| | | | | 365/225.7 |
| 2003/0185066 A1 | 10/2003 | Kihara | | |
| 2004/0232446 A1 * | 11/2004 | Nishimura | ......... | G01R 31/2884 |
| | | | | 257/202 |
| 2007/0091662 A1 * | 4/2007 | Matsubara | ............ | G11C 17/16 |
| | | | | 365/96 |
| 2007/0133323 A1 * | 6/2007 | Kim | ................ | G11C 29/789 |
| | | | | 365/200 |
| 2008/0042234 A1 * | 2/2008 | Yamaguchi | ............ | G11C 17/16 |
| | | | | 257/529 |
| 2009/0109790 A1 | 4/2009 | Miyatake et al. | | |
| 2010/0296329 A1 * | 11/2010 | Summerfelt | ............ | G11C 11/22 |
| | | | | 365/145 |
| 2011/0063017 A1 * | 3/2011 | Ishikawa | ........ | H03K 19/018521 |
| | | | | 327/534 |
| 2011/0158025 A1 * | 6/2011 | Cha | ................ | G11C 17/16 |
| | | | | 365/225.7 |
| 2011/0234303 A1 * | 9/2011 | Choi | ................ | G11C 17/18 |
| | | | | 327/525 |
| 2013/0162263 A1 * | 6/2013 | Kim | ................ | G11C 17/18 |
| | | | | 324/550 |
| 2013/0182518 A1 * | 7/2013 | Kim | ................ | G11C 17/16 |
| | | | | 365/201 |
| 2014/0029362 A1 * | 1/2014 | Adham | ................ | G11C 17/146 |
| | | | | 365/200 |
| 2014/0056084 A1 * | 2/2014 | Jeong | ................ | G11C 17/16 |
| | | | | 365/189.09 |
| 2014/0185397 A1 | 7/2014 | Franceschini et al. | | |
| 2015/0294740 A1 * | 10/2015 | Noh | ................ | G11C 29/70 |
| | | | | 365/189.05 |
| 2016/0293278 A1 * | 10/2016 | Kim | ................ | G11C 29/783 |

OTHER PUBLICATIONS phys.org, "Combination of SRAM and DRAM Capacitor Technology Enables Error-Free Low-Power-Consumption SRAM, " Jun. 23, 2004, available at: https://phys.org/news/2004-06-combination-sram-dram-capacitor-technology.html, pp. 1-2.

* cited by examiner

DYNAMIC RANDOM ACCESS MEMORY HAVING E-FUSES USED AS CAPACITORS COUPLED TO LATCHES

CROSS-REFERENCE TO RELATED APPLICATION

This application claims the priority benefit of China application serial no. 201611204889.0, filed on Dec. 23, 2016. The entirety of the above-mentioned patent application is hereby incorporated by reference herein and made a part of this specification.

BACKGROUND OF THE INVENTION

Field of the Invention

The invention relates to a semiconductor technique. Specifically, the invention relates to a dynamic random access memory.

Description of Related Art

A dynamic random access memory is a common memory, for example, applied to a smart electronic device so as to facilitate prompt performance of a to-do task. As the functions of smart electronic devices become more and more powerful, the required capacity of the dynamic random access memory increases. Moreover, with a trend toward reduction in size, density of memory cells has increased.

Under such requirement, it is hard to fabricate a dynamic random access memory with no defective memory cell in a memory cell array. Thus, the dynamic random access memory has a redundant component unit in addition to a main memory cell array. After completion of fabrication of the dynamic random access memory, it is necessary to test each memory cell in the main memory cell array, wherein a defective memory cell may be replaced by a redundant memory cell in the redundant component unit.

The redundant component unit includes a plurality of redundant memory cells and other redundant circuits for replacing defective memory cells. The redundant circuit generally includes a latch component, but there is possibility that data latched by the latch component may have an error.

Thus, how to reduce errors in the latched data without considerably changing of the design and structure of the dynamic random access memory needs to be taken into consideration during technology research and development.

SUMMARY OF THE INVENTION

The invention provides a dynamic random access memory having a main memory cell array and a redundant component unit. The redundant component unit includes a plurality of e-fuses and a latch region. The plurality of the e-fuses are arranged into a first e-fuse part and a second e-fuse part, wherein the first e-fuse part is used to store address information of a fault memory cell in the main memory cell array and the second e-fuse part is used as a plurality of capacitors. The latch region includes a plurality of latches used to store the address information of the fault memory cell stored in the first e-fuse part, wherein the plurality of the capacitors of the second e-fuse part are respectively coupled to the plurality of the latches to provide a capacitance value for an input/output (I/O) endpoint of each of the latches.

In an embodiment, according to the dynamic random access memory, the redundant component unit provides an additional plurality of row redundant memory cells and an additional plurality of column redundant memory cells for the main memory cell array.

In an embodiment, according to the dynamic random access memory, a decoder and an e-fuse driver are further included, wherein the e-fuse driver is used to transmit the address information to the latch region, and the decoder is used to activate a redundant memory cell in the redundant component unit that corresponds to the address information.

In an embodiment, according to the dynamic random access memory, semiconductor structures of the plurality of the capacitors in the second e-fuse part respectively overlap above the e-fuse driver.

In an embodiment, according to the dynamic random access memory, the e-fuse driver is a metal oxide semiconductor field effect transistor (MOSFET).

In an embodiment, according to the dynamic random access memory, the plurality of the e-fuses are arranged into a plurality of e-fuse units, each of the e-fuse units includes a plurality of the e-fuses having a separation distance therebetween, and the separation distance is equal to a size of two or three of the e-fuses.

In an embodiment, according to the dynamic random access memory, each of the plurality of the capacitors is coupled to the I/O endpoint of the corresponding one of the plurality of the latches.

In an embodiment, according to the dynamic random access memory, the I/O endpoint in a single-ended latch circuit structure is connected to a bit line of the dynamic random access memory.

In an embodiment, according to the dynamic random access memory, the second e-fuse part includes a plurality of first capacitors and a plurality of second capacitors, and each of the plurality of the latches has a double-ended latch circuit structure, wherein each of the plurality of the first capacitors is connected to a first I/O endpoint of each of the latches, and each of the plurality of the second capacitors is connected to a second I/O endpoint of each of the latches.

In an embodiment, according to the dynamic random access memory, the first I/O endpoint is connected to a bit line of the dynamic random access memory and the second I/O endpoint is connected to an anti-bit line of the dynamic random access memory.

In an embodiment, according to the dynamic random access memory, the plurality of the latches are current mirror type circuits, high resistance type circuits or thin film transistor type circuits.

Based on the above, the dynamic random access memory proposed by the invention is changed to a capacitor by using the e-fuse structure and is connected to the I/O end of the latch so as to reduce probability of occurrence of soft errors in data stored in the latch. Since the capacitor has the same structure as that of the e-fuse, a great change in the dynamic random access memory can be avoided and a significant increase in fabrication cost can be prevented.

To make the aforementioned and other features and advantages of the invention more comprehensible, several embodiments accompanied with drawings are described in detail as follows.

DESCRIPTION OF THE EMBODIMENTS

A general structure of a dynamic random access memory (DRAM) includes a main block composed of a memory cell array, and a redundant component unit. In general, the redundant component unit includes blocks such as a plurality of redundant memory cells, a decoder, an e-fuse and a latch. A plurality of memory cells in the memory cell array in the main block activate a test program, for example, after completion of fabrication or whenever testing is required. After testing, when at least one memory cell is found to be unable to correctly store data, these memory cells are considered defective memory cells, and a row address and a column address corresponding to the data are stored by the e-fuse. When the dynamic random access memory is in normal use, the address information stored in the e-fuse is downloaded to the latch block, the decoder then activates the corresponding row address and the column address, and a redundant memory cell is designated to replace the memory cell in the main block that has the error.

Figure 1:
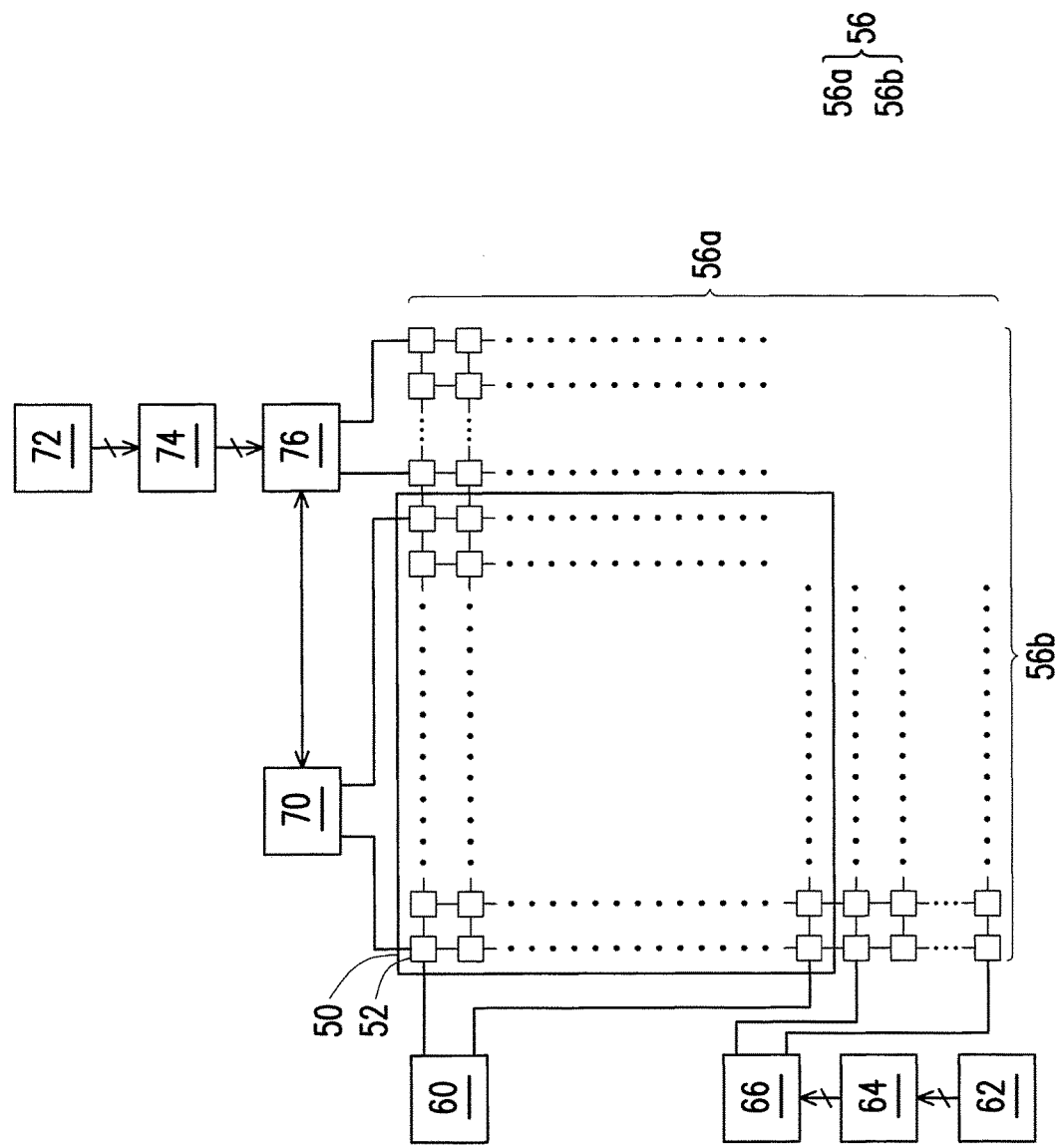
FIG. 1 is a schematic view of a circuit structure of a dynamic random access memory according to an embodiment of the invention.

FIG. 1 is a schematic view of a circuit structure of a dynamic random access memory according to an embodiment of the invention. Referring to FIG. 1, before description of the structure of the dynamic random access memory proposed by the invention, a structure of a general dynamic random access memory is described for studying a mechanism of repairing a defective memory cell using a redundant component. In general, the dynamic random access memory includes a main memory cell array 50 formed by arranging a plurality of memory cells 52 in an array, and positions of the memory cells 52 are defined by column addresses and row addresses. Therefore, a row decoder 60 is used to activate the corresponding row address in the main memory cell array 50, and a column decoder 70 is used to activate the corresponding column address in the main memory cell array 50. If all the memory cells 52 in the main memory cell array 50 are normal without any defect, there will be no use of an external redundant component unit. The redundant component unit includes, for example, a redundant memory cell 56. The redundant memory cell 56 includes, for example, a column redundant memory cell 56a and a row redundant memory cell 56b. The redundant component unit further includes a column e-fuse block 72, a column e-fuse latch block 74, and a column e-fuse decoder block 76 for controlling the column redundant memory cell 56a. Also, the redundant component unit further includes a row e-fuse block 62, a row e-fuse latch block 64 and a row e-fuse decoder 66 for controlling the row redundant memory cell 56b.

The row e-fuse block 62 and the column e-fuse block 72 both include a predetermined sufficient number of e-fuses. A plurality of e-fuses constitutes an e-fuse unit for storing row or column information. In conventional practice, when an error is detected in the memory cell of the dynamic random access memory, the row and column information of the memory cell having the error is first recorded using the e-fuse by a mechanism such as a laser. During operation of the dynamic random access memory, after the power is turned on, the row/column address information of the defective memory cell recorded in the e-fuse blocks 62 and 72 is written to the e-fuse latch blocks 64 and 74 using a driver between the e-fuse blocks 62 and 72 and the e-fuse latch blocks 64 and 74. When writing or reading is performed on the main memory cell array 50, if it is found that the row/column address information is recorded in the e-fuse latch blocks 64 and 74, it means that the corresponding memory cell is defective. Accordingly, the e-fuse decoder blocks 66 and 76 activate the corresponding row/column address information to select the corresponding redundant memory cell among the column/row memory cells 56a and 56b for replacing the memory cell in the main block that has the error.

That is to say, in the dynamic random access memory, when a defective memory cell is found during testing, the row e-fuse block 62 and the column e-fuse block 72 respectively record the row address information and the column address information of the defective memory cell. Then, during subsequent use of the dynamic random access memory, when the power is turned on, the data of the e-fuse blocks is stored in the row/column e-fuse latch blocks 64 and 74 for enabling the host to rapidly obtain the row/column address information of the defective memory cell. When the row/column address information in the e-fuse latch blocks 64 and 74 is used by actual data, the e-fuse decoder blocks 66 and 76 activate the row/column address information of the redundant memory cell for replacing the row/column address information of the main block.

Herein, the arrangement of the redundant component unit of the invention is not limited to that in FIG. 1. As long as the effect that the redundant component is used to record and replace the memory cell of the main block is achieved, other arrangements are also possible.

Figure 2:
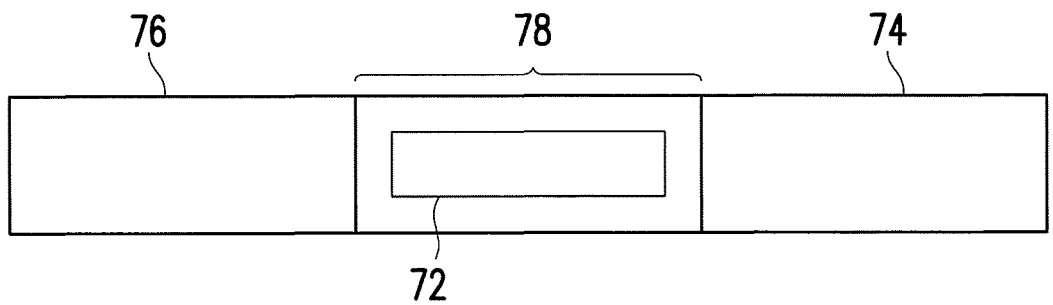
FIG. 2 is a schematic view of a circuit repair structure of the dynamic random access memory according to an embodiment of the invention.
Figure 3:
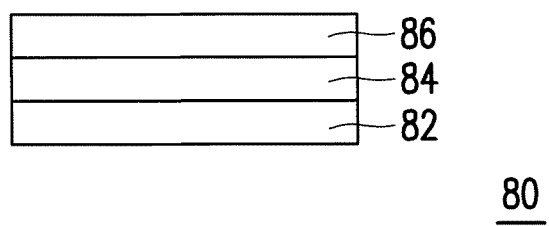
FIG. 3 is a schematic view of an e-fuse structure according to an embodiment of the invention.

FIG. 2 is a schematic view of a circuit repair structure of the dynamic random access memory according to an embodiment of the invention. Referring to FIG. 2, a layout of the redundant component unit is, for example, a strip-shaped structure having a size of, for example, 20 μm in length and 1 μm in width. For instance, in tellers of column, the long strip-shaped block includes the e-fuse decoder block 76, the e-fuse block 72 and the e-fuse latch block 74. A driver block 78 transmits the data of the e-fuse block 72 to the e-fuse latch block 74. In a general arrangement, the e-fuse block 72 overlaps the driver block 78, and a unit of the driver block 78 is, for example, a MOSFET FIG. 3 is a schematic view of an e-fuse structure according to an embodiment of the invention. Referring to FIG. 3, a basic structure of an e-fuse 80 of the e-fuse block 72 is a capacitor including a lower electrode layer 82 and an upper electrode layer 86, wherein a dielectric layer 84 having a high dielectric constant is between the upper electrode layer 86 and the lower electrode layer 82. The e-fuse 80 may fuse and penetrate into the dielectric layer 84 by other operation mechanisms so as to electrically connect the upper electrode layer 84 to the lower electrode 80 and change its state for storing data.

Figure 4:
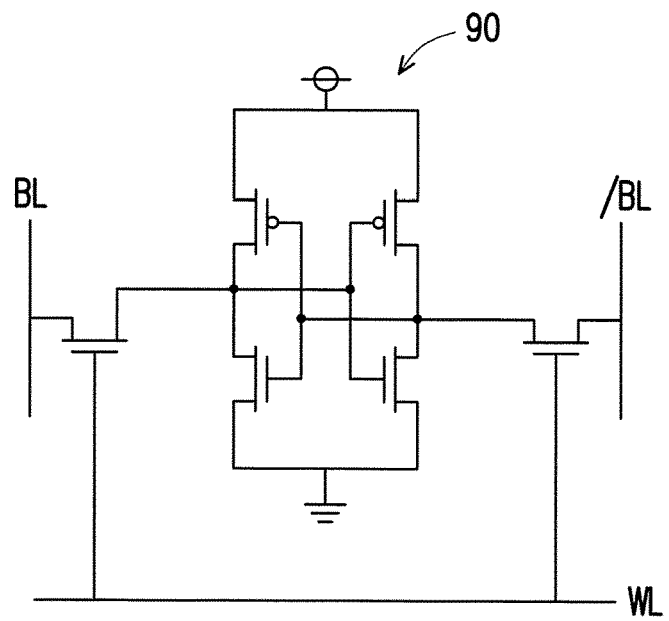
FIG. 4 is a schematic view of a double-ended latch circuit used in the invention according to an embodiment of the invention.

FIG. 4 is a schematic view of a double-ended latch circuit used in the invention according to an embodiment of the invention. Referring to FIG. 4, a latch circuit 90 of the dynamic random access memory is, for example, a general double-ended latch circuit composed of two symmetrical paths formed by a P-type MOS transistor and an N-type MOS transistor connected in series. One I/O end of the latch circuit 90 is connected to a bit line BL through a MOS transistor, and the other I/O end is connected to an anti-bit line "/BL" through another MOS transistor. The bit line BL has an opposite power level to the anti-bit line "/BL", and gates of the two MOS transistors are connected to a word line WL.

Figure 5:
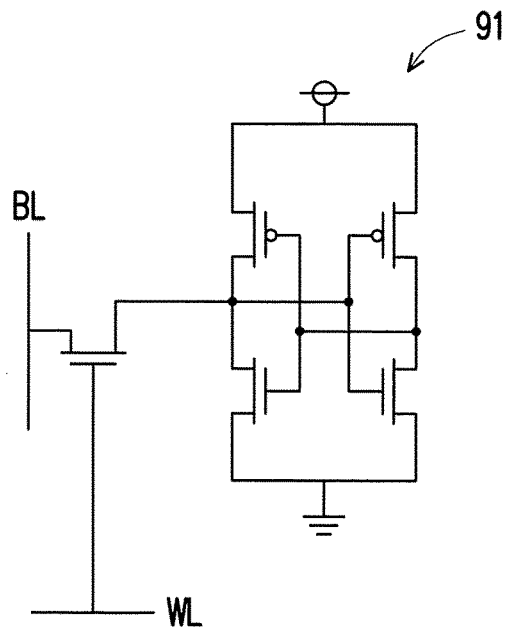
FIG. 5 is a schematic view of a single-ended latch circuit used in the invention according to an embodiment of the invention.

FIG. 5 is a schematic view of a single-ended latch circuit used in the invention according to an embodiment of the invention. Referring to FIG. 5, the latch circuit 90 of the dynamic random access memory is, for example, a general single-ended latch circuit 91 similar to the latch circuit of FIG. 4 but only connected to the bit line BL at an input end thereof through a MOS transistor. That is, one end of the single-ended latch circuit 91 is not connected to the bit line BL, and the other end may be connected to the bit line BL of the dynamic random access memory or the word line WL of a redundant selection circuit. That is, the connection manner is to connect a single endpoint to the outside according to actual needs, but is not limited to a specific outward connection circuit.

Figure 6:
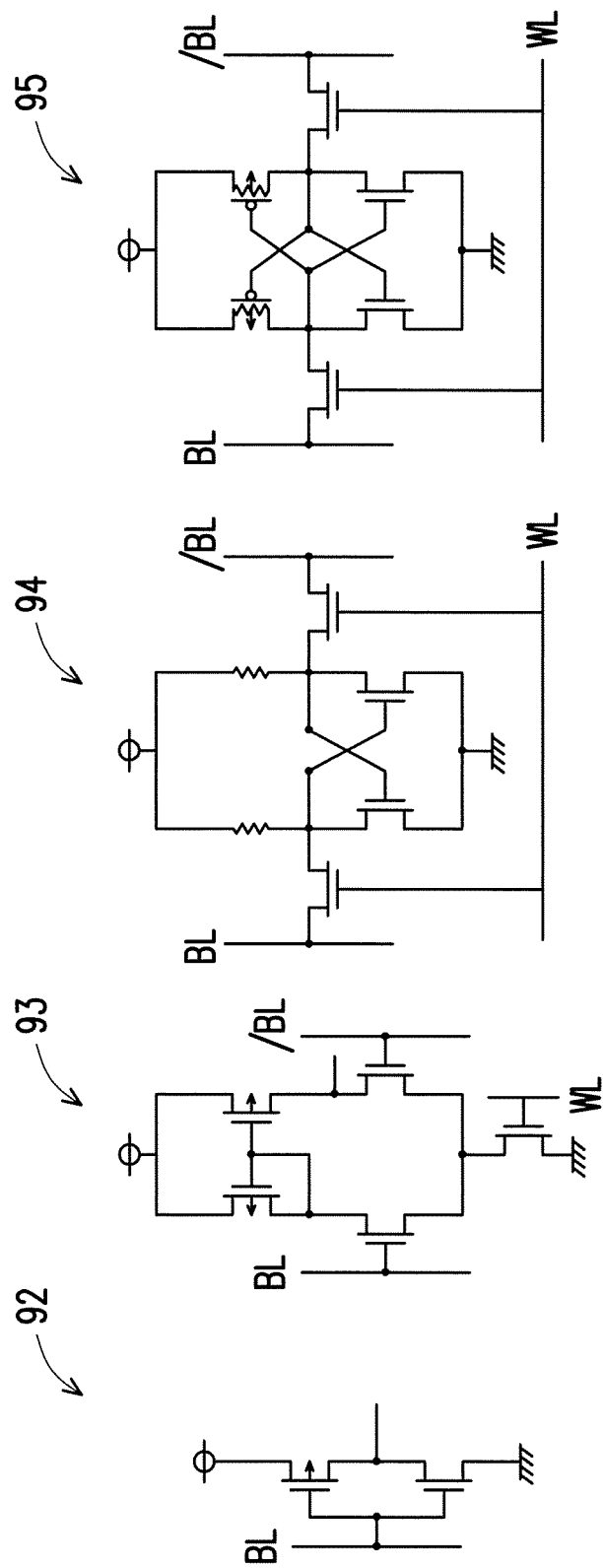
FIG. 6 is a schematic view of a plurality of kinds of latch circuits used in the invention according to an embodiment of the invention.

The latch circuit of the dynamic random access memory of the invention is not limited to the aforementioned latch circuits 90 and 91. FIG. 6 is a schematic view of a plurality of kinds of latch circuits used in the invention according to an embodiment of the invention. Referring to FIG. 6, the latch circuit of the dynamic random access memory of the invention may be a single-ended path circuit 92, a current mirror type circuit 93, a high resistance type circuit 94, or a thin film transistor type circuit 95, respectively. These latch circuits are modifications understandable to and can be adopted by persons skilled in the art. The invention is not limited to a specific latch circuit.

Regarding the structure of the above dynamic random access memory, as the demand for storage capacity increases, the component density of the latch circuit is increased and the size of the latch circuit is reduced. A soft error easily occurs in the latch circuit. Since soft errors do not occur in a constant manner, it is hard to constantly remove them through testing. To solve the issue of occurrence of soft errors in the latch circuit, in the invention, a capacitor having a large capacitance value is added at the input end or at both the input end and the output end of the latch circuit, so as to effectively solve the issue of soft errors.

Figure 7:
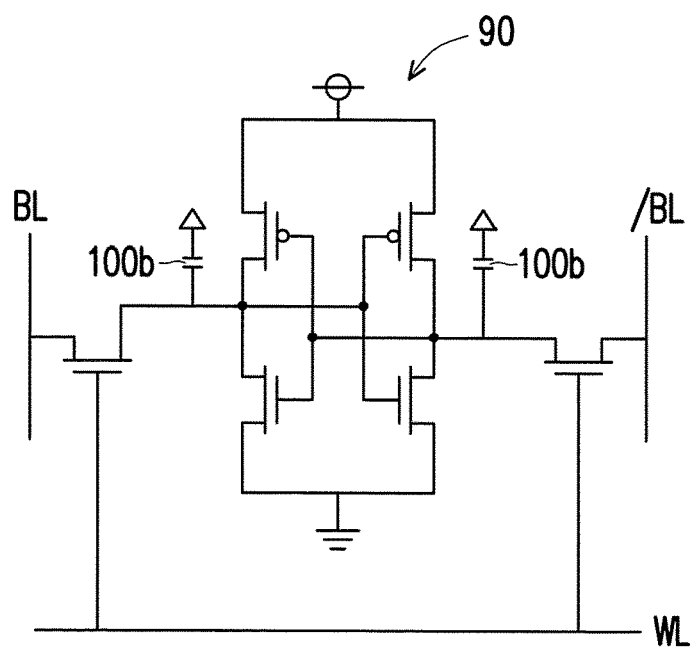
FIG. 7 is a schematic view of a latch circuit used in the invention according to an embodiment of the invention.

FIG. 7 is a schematic view of a latch circuit used in the invention according to an embodiment of the invention. Referring to FIG. 7, based on the double-ended latch circuit of FIG. 4, to reduce the probability of occurrence of soft errors, a capacitor 100b having a high capacitance value may be added respectively at both ends of the latch circuit 90. Technically, the study of soft errors in the latch circuit has proved that the added capacitor 100b effectively eliminates possible causes of soft errors so that the probability of occurrence of soft errors in the latch circuit can be reduced.

Upon overall consideration and study of the basic structure of the aforementioned dynamic random access memory and reduction of soft errors in the latch circuit, the invention proposes a revised design of the dynamic random access memory, which is a dynamic random access memory capable of effectively eliminating soft errors in the latch circuit while approximately maintaining the basic structure of the dynamic random access memory.

Figure 8:
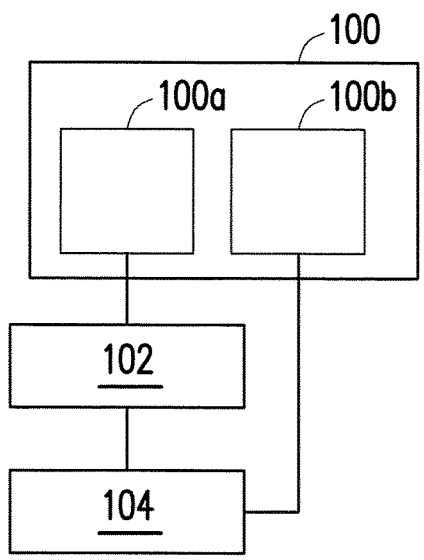
FIG. 8 is a schematic view of a structure of a redundant component unit according to an embodiment of the invention.

FIG. 8 is a schematic view of a structure of a redundant component unit according to an embodiment of the invention. Referring to FIGS. 1, 3, 7 and 8 together, the invention discloses a dynamic random access memory having a main memory cell array and a redundant component unit. The redundant component unit includes an e-fuse block 100 and a latch region 104. The e-fuse block 100 is composed of a plurality of e-fuses. The plurality of e-fuses of the e-fuse block 100 are arranged into a first e-fuse part 100a and a second e-fuse part 100b, wherein the e-fuses of the first e-fuse part 100a are used to store address information of a fault memory cell in the aforementioned main memory cell array 50. The e-fuses of the second e-fuse part 100b are used as capacitors 100b instead of e-fuses for storing row/column address, and are connected to a latch circuit in the latch region 104 that has, for example, the structure shown in FIG. 7. The latch region 104 includes a plurality of latches used to store the address information of the fault memory cell stored in the first e-fuse part 100a through data transmission of the driver block 102. That is, the plurality of the capacitors 100b of the second e-fuse part are respectively coupled to the plurality of the latches to provide a capacitance value for an input/output (I/O) endpoint of each of the latches.

The invention proposes arranging a predetermined general e-fuse block into two parts. Since the e-fuse has the same structure as that of the capacitor, in the invention, one part of the e-fuses remain functioning as e-fuses while the other part of the e-fuses are used as capacitors and are connected to the input end or both the input end and the output end of the latch circuit of the latch block, so as to eliminate soft errors.

Figure 9:
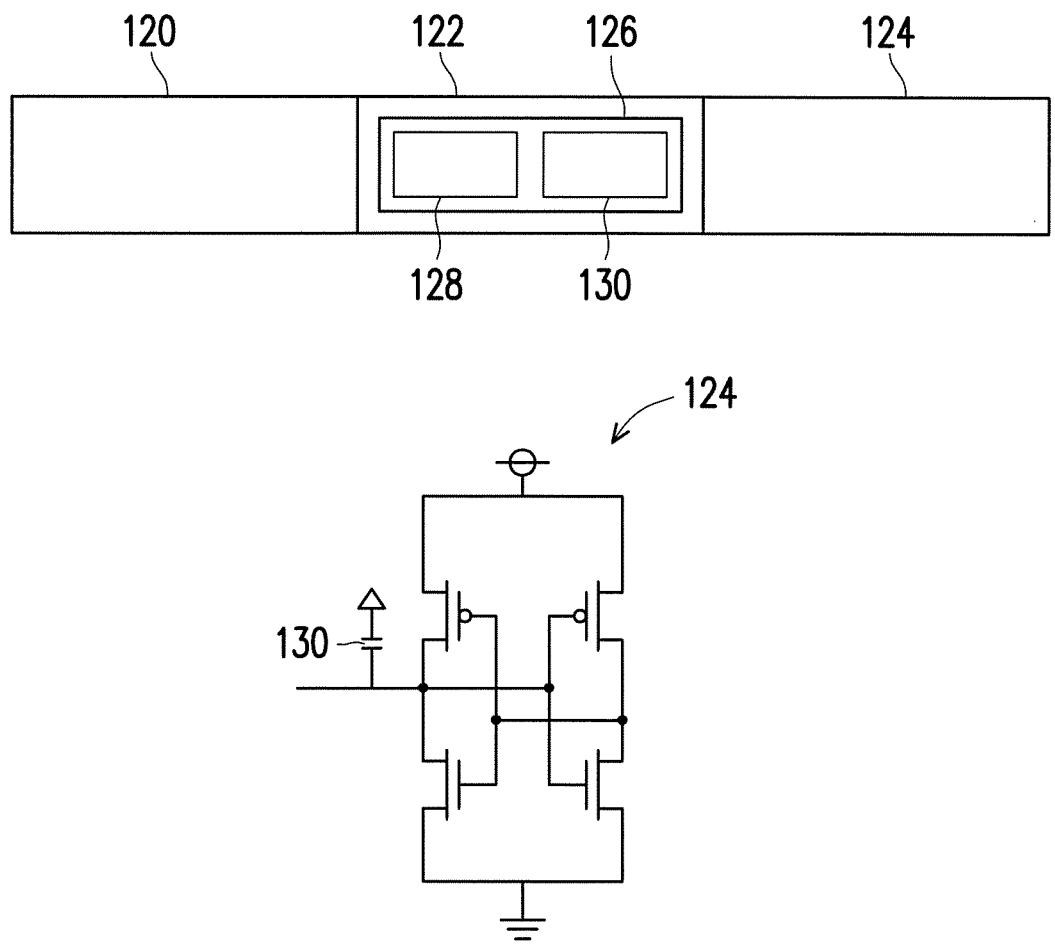
FIG. 9 is a schematic view of a structure of the redundant component unit and the latch circuit according to an embodiment of the invention.

FIG. 9 is a schematic view of a structure of the redundant component unit and the latch circuit according to an embodiment of the invention. Referring to FIG. 9, the invention proposes a layout corresponding to the arrangement of the redundant component. For example, a single-ended latch has a circuit as shown in the lower diagram of FIG. 9 and a component layout is as shown in the upper diagram of FIG. 9. The redundant component unit includes an e-fuse decoder block 120, an e-fuse driver block 122 and a latch block 124 arranged in a long strip-shaped area having a size of, for example, 20 µm in length and 1 µm in width. An e-fuse block 126 is above the driver block 122 and thus maintains a long strip shape.

E-fuses of the e-fuse block 126 have the same structure, but are arranged into a first e-fuse part 128 and a second e-fuse part 130. The latch 124 of the present embodiment is a single-ended circuit and thus has only one endpoint. E-fuses of the second e-fuse part 130 are used as capacitors 130 and are connected to the I/O end of the latch 124.

Figure 10:
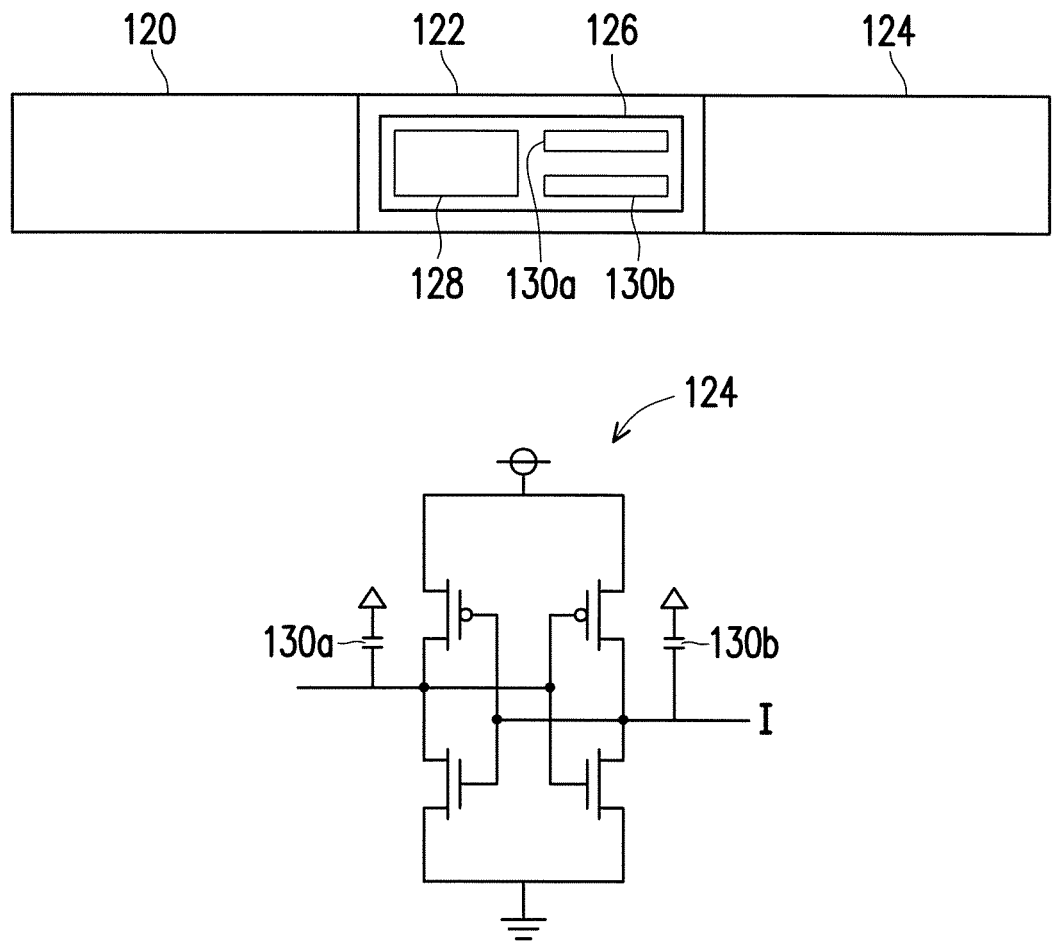
FIG. 10 is a schematic view of a structure of the redundant component unit and the latch circuit according to an embodiment of the invention.

FIG. 10 is a schematic view of a structure of the redundant component unit and the latch circuit according to an embodiment of the invention. Referring to FIG. 10, the latch 124 of the present embodiment is a double-ended circuit, and thus has two capacitors 130a and 130b. Therefore, the arrangement of the e-fuse block 126 includes a second e-fuse part for providing the two capacitors 130a and 130b.

In addition, for the e-fuse, a plurality of and a plurality of kinds of e-fuses is provided based on arrangements having different effects. Each e-fuse unit includes, for example, a plurality of e-fuses. To ensure a space between the e-fuse units, a separation distance, for example, is defined, and the separation distance is, for example, equal to a size of two to three e-fuses.

The dynamic random access memory proposed by the invention is changed to the capacitor by using the e-fuse structure and is connected to the I/O end of the latch so as to reduce probability of occurrence of soft errors in the data stored in the latch. Since the capacitor has the same structure as that of the e-fuse, a great change in the dynamic random access memory can be avoided and a significant increase in fabrication cost can be prevented.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A dynamic random access memory, comprising:
   a main memory cell array and a redundant component unit, wherein the redundant component unit comprises:
   a plurality of e-fuses, arranged into a first e-fuse part and a second e-fuse part, wherein the first e-fuse part is used to store address information of a fault memory cell in the main memory cell array and the second e-fuse part is used as a plurality of capacitors; and
   a latch region, comprising a plurality of latches used to store the address information of the fault memory cell stored in the first e-fuse part, wherein the plurality of the capacitors of the second e-fuse part are respectively coupled to the plurality of the latches to provide a capacitance value for an input/output (I/O) endpoint of each of the latches.

2. The dynamic random access memory according to claim 1, wherein the redundant component unit provides an additional plurality of row redundant memory cells and an additional plurality of column redundant memory cells for the main memory cell array.

3. The dynamic random access memory according to claim 1, further comprising a decoder and an e-fuse driver, wherein the e-fuse driver is used to transmit the address information to the latch region, and the decoder is used to activate a redundant memory cell in the redundant component unit that corresponds to the address information.

4. The dynamic random access memory according to claim 3, wherein semiconductor structures of the plurality of the capacitors in the second e-fuse part respectively overlap above the e-fuse driver.

5. The dynamic random access memory according to claim 3, wherein the e-fuse driver is a metal oxide semiconductor field effect transistor (MOSFET).

6. The dynamic random access memory according to claim 1, wherein the plurality of the e-fuses are arranged into a plurality of e-fuse units, each of the e-fuse units comprises a plurality of the e-fuses having a separation distance therebetween, and the separation distance is equal to a size of two or three of the e-fuses.

7. The dynamic random access memory according to claim 1, wherein each of the plurality of the capacitors is coupled to the I/O endpoint of the corresponding one of the plurality of the latches.

8. The dynamic random access memory according to claim 7, wherein the plurality of the latches comprises a single-ended latch circuit structure, and the single-ended circuit has a single I/O endpoint connected to the outside.

9. The dynamic random access memory according to claim 7, wherein the second e-fuse part comprises a plurality of first capacitors and a plurality of second capacitors, and each of the plurality of the latches has a double-ended latch circuit structure, wherein each of the plurality of the first capacitors is connected to a first I/O endpoint of each of the latches, and each of the plurality of the second capacitors is connected to a second I/O endpoint of each of the latches.

10. The dynamic random access memory according to claim 9, wherein the first I/O endpoint is connected to a bit line of the dynamic random access memory and the second I/O endpoint is connected to an anti-bit line of the dynamic random access memory.

11. The dynamic random access memory according to claim 1, wherein the plurality of the latches are current mirror type circuits, high resistance type circuits or thin film transistor type circuits.

* * * * *